United States Patent [19]
Bjork et al.

[11] Patent Number: 5,128,619
[45] Date of Patent: Jul. 7, 1992

[54] SYSTEM AND METHOD OF DETERMINING CABLE CHARACTERISTICS

[76] Inventors: Roger A. Bjork, 2904 Oak Bend, Round Rock, Tex. 78681; John T. Chapman, 1035 Aster Ave. #2143, Sunnyvale, Calif. 94086; Harry L. Cochrane, Rte. 2 Box 423, Liberty Hill, Tex. 78642; Timothy L. Wilson, 9200 N Plaza #2510, Austin, Tex. 78753

[21] Appl. No.: 759,044

[22] Filed: Sep. 5, 1991

Related U.S. Application Data

[63] Continuation of Ser. No. 332,862, Apr. 3, 1989, abandoned.

[51] Int. Cl.$^5$ .......................................... G01R 31/11
[52] U.S. Cl. .................. 324/533; 324/534; 379/26; 379/6
[58] Field of Search ............. 324/533, 532, 534; 379/6, 24, 26, 30, 32

[56] References Cited

U.S. PATENT DOCUMENTS

| | | | |
|---|---|---|---|
| 2,800,627 | 7/1957 | Oudin et al. | 324/533 |
| 3,683,282 | 8/1972 | D'Amato et al. | 324/614 |
| 4,165,482 | 8/1979 | Gale | 324/523 |
| 4,325,022 | 4/1982 | Pelletier | 324/533 |
| 4,739,276 | 4/1988 | Graube | 324/534 |
| 4,766,386 | 8/1988 | Oliver et al. | 324/533 |
| 4,766,549 | 8/1988 | Schweitzer, III et al. | 324/533 |
| 4,768,203 | 8/1988 | Ingle | 379/6 |

FOREIGN PATENT DOCUMENTS 2073549  10/1981  United Kingdom ................ 379/24

OTHER PUBLICATIONS

"Communications Network Testing", G. Immeyer et al, *IBM Technical Disclosure Bulletin*, vol. 22, No. 8A, Jan. 1980, pp. 3334-3335.
"Time Domain Reflectrometry: Versatile New Way of Testing Cable", J. Trudel, *Telephony*, Jan. 19, 1976.
"TDR for Cable Testing", TEK 1500 Series Metallic Cable TDR's, Application Note AX-3241-1.
"Measurement System for Attenuation, Numerical Aperture, Dispersion, and Optical Time Domain Reflectometry in Infrared Optial Fibers", *Proc SPIE Int. Soc. Opt. Eng.*, vol. 618, 1986, pp. 151-158.
"Measuring System for ISDN", *Journal Electron, Eng.*, Dec. 1987, pp. 56-57.

*Primary Examiner*—Kenneth A. Wieder
*Assistant Examiner*—Maura K. Regan
*Attorney, Agent, or Firm*—Perman & Green

[57] ABSTRACT

A method of and system for automatically determining length, attenuation, impedance and existence of bridge taps on installed communication cable having access to only one end of the cable. A waveform, which includes incident and reflected pulses, is analyzed to determine the presence of significant pulses. The presence of only one positive significant pulse indicates the absence of any discontinuities and facilitates the calculation of a signal-to-noise ratio which determines whether the cable will support the operation of digital communication thereon. The presence of more than one positive significant pulse or a negative pulse indicates the presence of at least one fault on the cable which prevents the operation of digital communication on the cable.

14 Claims, 4 Drawing Sheets

SYSTEM AND METHOD OF DETERMINING CABLE CHARACTERISTICS

This is a continuation of copending application(s) Ser. No. 07/332,862 filed on Apr. 3, 1988 now abandoned.

TECHNICAL FIELD

This invention relates generally to a system for and method of determining cable characteristics, and more specifically to a system for and method of determining characteristics of installed cable for digital communications.

BACKGROUND INFORMATION

During recent times, the communication technology has changed from analog type systems to systems which communicate in a digital format. In the telecommunications industry, digital private branch and computer branch exchanges are rapidly replacing analog systems. With the introduction of digital telephones, it was common to rewire buildings which housed the analog system being replaced in order to insure the proper operation of the digital telephones. The cost associated with the rewiring oftentimes was twenty-five to fifty percent of the cost of a digital telephone system and made the transition from an analog telephone system to a digital telephone economically less cost effective. Although some digital telephone systems are designed to operate on standard twisted pair cable, there are restrictions which prevent the telephone system form working on all wires which support an analog system.

Presently, there is automatic test equipment available which is designed to test communication lines for use with analog telephones. The test equipment calculates any or all of the following: impedance, attenuation, cable length and discontinuities. However, these parameters are calculated at frequencies which are applicable only to analog telephone systems and does not facilitate the location of all types of discontinuites.

Time domain reflectometers (TDRs), which are either metallic or optical, have been used in automated cable testers. There is a major difference between optical and metallic TDRs in that optical TDRs only measure attentuation and cable discontinuities of fiber optic cable. A cable parameter such as impedance, which is important in determining the quality of metallic cables, is not applicable to determining the quality of a fiber optic cable. Thus, an optical TDR cannot be used to determine the quality of metallic cables.

In the computer industry, telephone or twisted pair cable has been tested to determine its use in local area network (LAN) applications. Data tranmission rates on LANs can be as high as 10 Mbps. However, this testing has occurred only in a laboratory environment and involves using a network analyzer as well as having access to both ends of the cable.

Generally, existing cable testers test cables within a 300-3400 Hz frequency range. Data is transmitted within a digital system as a frequency of 256 KHz. Thus, existing cable testers are not able to test existing cable for digital applications. Moreover, the existing cable testers require access to both ends of the cable which requires additional personnel and increases cost associated with determining the quality of the communication cable.

Consequently, what is needed is a test apparatus for testing cable for digital applications from one end of the cable.

DISCLOSURE OF THE INVENTION

This invention relates to system for and method of determining cable characteristics by accessing only one end of a communication cable. An incident pulse is transmitted over the communication cable. In response to the incident pulse, a waveform, including any pulses reflected from the cable, is detected. The waveform is digitized into a plurality of time samples. First, second and third derivatives of each of the plurality of time samples are calculated. Each of the time samples are then analyzed to determine whether a significant pulse is included in the waveform. If only one positive significant pulse is found, the length of the communication cable and the attenuation are calculated. Thereafter, a signal-to-noise ratio is calculated which indicates whether the communication cable will support the operation of digital communication thereon. However, if more than one positive significant pulse or a negative significant pulse is found, the communication cable includes at least one fault which will prevent the operation of digital communication thereon.

BEST MODE FOR CARRYING OUT THE INVENTION

Figure 1:
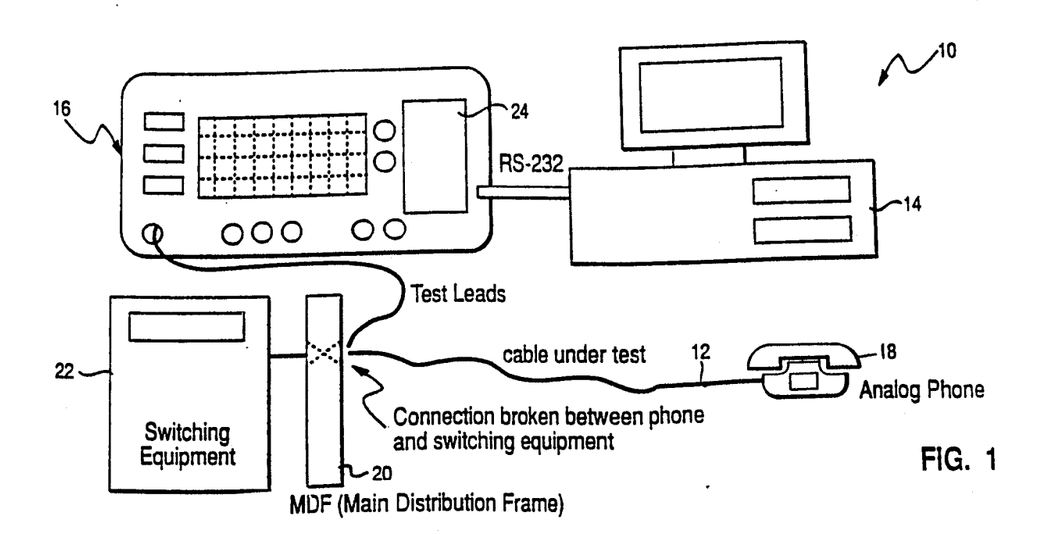
FIG. 1 illustrates a system for determining characteristics of a communication cable.

FIG. 1 illustrates a system 10 for determining the quality of a communication cable 12 having at least one pair of wires. System 10 includes a computer 14, such as an IBM PC Convertible, and a pulse-type time domain reflectometer (TDR) 16, such as a Tektronix 1503B. Cable 12 is coupled to a telephone station set 18 at a first end thereof and a main distribution frame 20 at a second end thereof. Switching equipment 22 in the form of a private branch or computer branch exchange is coupled to the main distribution frame 20. The computer 14 and the TDR 16 are coupled together through their respective serial ports. The computer 14 utilizes an application program to access data acquired by the TDR 16 and calculates the length, attenuation, impedance and existence of any bridge taps or other discontinuities on a selected wire pair within the cable 12 from only one end of the cable. To determine the quality of the selected wire pair, it is assumed that the selected wire pair is temporarily disconnected from the switching equipment 22 and that the first end of the selected wire pair is either an open circuit or has an impedance that is a close approximation of an open circuit, such as an analog station set 18 being in an on-hook position.

System 10 is designed for conservative test results through the use of conservative test parameter settings in the TDR 16. In testing cable using the best mode of the invention, one unknown parameter, the velocity of propagation (Vp), of the cable 12 must be accounted for when testing the quality of the cable. The Vp parameter, which affects the determination of the length of the cable, has no effect upon the determination of the impedance or attenuation calculated for the cable under test. The Vp parameter of the TDR 16 is set to 0.65 times the speed of light. This is slightly above the average Vp seen in standard telephone cables. Most standard telephone cables have a Vp between 0.50 and 0.69. Therefore, if there is an error in the length determination due to the assumed Vp parameter of the cable under test, it will almost always effect the length measurement in a positive direction which would be conservative for the pass/fail criteria and the significant discontinuity checking.

Figure 2A:
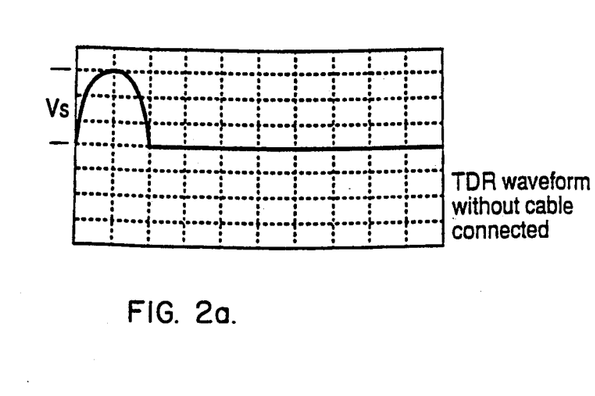
FIGS. 2a-2b show TDR waveform diagrams.
Figure 2B:
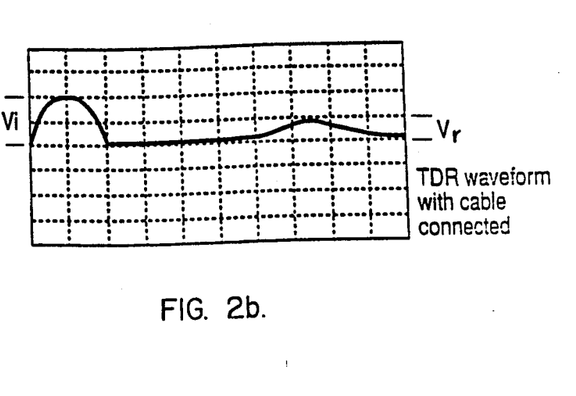

The application program utilized by the computer 14 controls the settings of the TDR 16 and reads a waveform from a display screen 24 associated with the TDR in digital form. The TDR waveform represents a signal on the cable 12 being tested. FIG. 2, which shows the TDR waveforms with the cable 12 both connected and disconnected from the TDR 16, includes a source pulse (Vs), a reflected pulse (Vr) and an incident pulse (Vi). By analyzing the digitized waveform taken from the TDR 16, the impedance, attenuation, length of the cable and the presence of bridge taps may be calculated. Note that the source pulse is a half sine wave. The half sine wave pulse represents a packet of energy that is more tolerant of cable attenuation and thus can be used to test longer cables.

The pulse width (Tw) of a signal transmitted by the TDR 16 is calculated at the fifty percent amplitude point of the signal. As noted above, the transmitted signal is a half sine wave, the time between zero crossing is (1.5 * Tw). The fundamental frequency of the half sine wave is a full sine wave with the same pulse width. The full sine wave would have a period of (3 * Tw). Therefore, the equivalent measurement frequency (Fc) of the TDR 16 depends on the pulse width and is calculated by the following formula:

$$Fc = 1 / (3 * Tw)$$

where Tw is the pulse width of the TDR 16.

The impedance and attenuation parameters of the selected wire pair of the cable 12 are measured with a 1000 ns pulse. At a pulse width of 1000 ns, the equivalent measurement frequency is 333 KHz. The equivalent measurement frequency of 333 KHz is close to the 256 KHz operating frequency of digital telephone systems so as to give valid results with a three percent error factor.

With the Vp noted above, the 1000 ns half sine wave has a wavelength of approximately 500 feet. With this wavelength, reflections caused by cables having a length less than 500 feet are very difficult to detect. It has been determined that digital telephones will operate on any telephone cable which is less than 500 feet as long as there are no significant discontinuities on the cable. In order to verify the absence of significant discontinuities on such a short cable, the cable is checked for discontinuities using a 100 ns pulse which has a wavelength of approximately 50 feet. Using the 100 ns pulse width, bridge taps as short as 25 feet can be detected within the first 750 feet of the cable under test.

For bridge taps which are less than 150 feet in length, the 1000 ns pulse will not cause a normal reflection but will cause enough extra reflected pulses which can be detected although its exact location may not be accurately determined.

Figure 3:
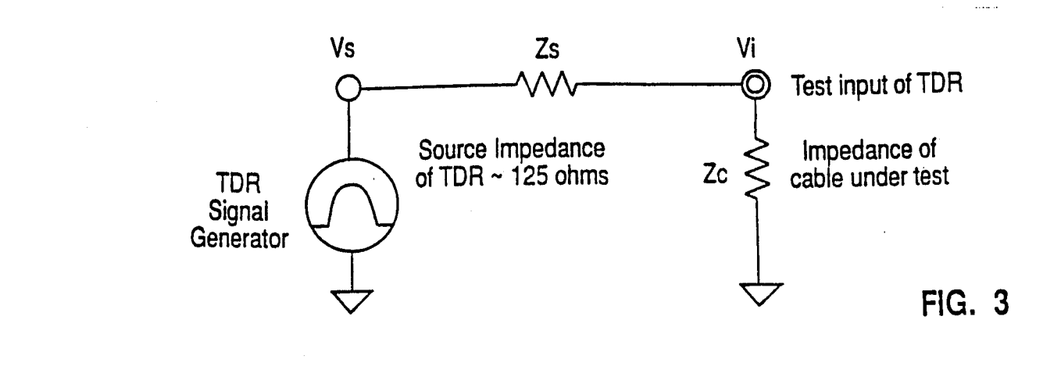
FIG. 3 shows an equivalent circuit used for cable impedance calculation.

The impedance of the cable under test is calculated from a voltage divider caused by the impedance of the cable in series with a source impedance associated with the TDR 16. FIG. 3 illustrates an equivalent circuit used for the cable impedance calculation. The TDR source impedance (Zs) represents the lumped source impedance of the TDR 16 and the cable impedance (Zc) represents the distributed cable impedance. Given the difference between the unconnected and connected TDR initial pulse is across Zc, the following current loop equation can be written:

$$Vi / Zc = (Vs - Vi) / Zs$$

Solving for the cable impedance, Zc yields:

$$Zc = Zs * (Vi / (Vs - Vi))$$

where
Zs = TDR source impedance
Vs = amplitude of source pulse w/o cable.
Vi = amplitude of source pulse with cable connected.

The attenuation of the cable 12 can be calculated by comparing the amplitude of the incident and reflected pulses, assuming that the reflected pulse is caused by the open end of the cable 12. Generally, the attenuation of two voltages V1 and V2 is given by:

$$\text{Attenuation} = 20 \log (V2/V1)$$

For purposes of determining the quality of the cable 12, two factors have an impact on this equation: (1) the reflect pulse (Vr) has traveled twice the length of the cable and therefore the cable attenuation is only one-half of the normally calculated attenuation; and (2) a mismatch in impedance which takes place between the cable impedance and the source impedance associated with the TDR 16.

Figures 4A, 4B:
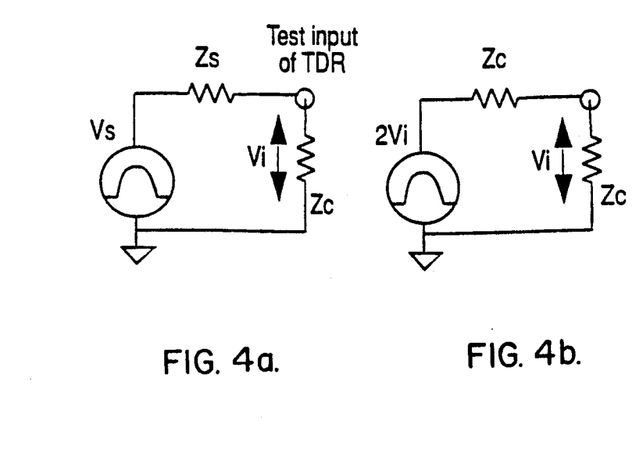
FIG. 4 a plurality of equivalent circuits for attenuation calculation.
Figure 4C:
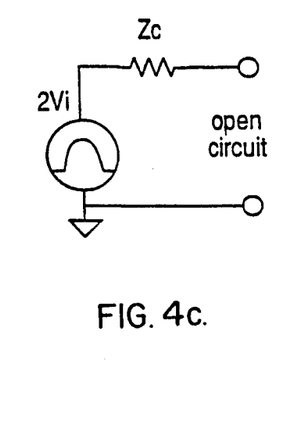
Figure 4D:
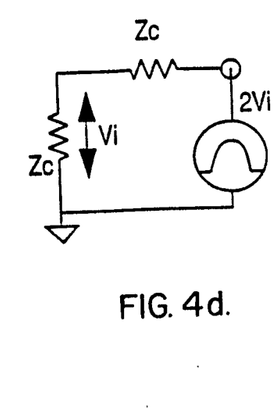
Figure 4E:
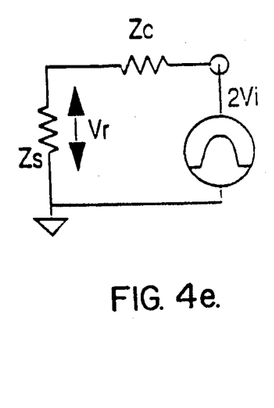

FIGS. 4a through 4e show a plurality of equivalent circuits which are used in the derivation of an attenuation correction factor due to the mismatch of the TDR and cable impedances. For purposes of the derivation, a lossless cable is assumed. FIG. 4a shows a near end cable seen by the pulse transmitted by the TDR 16. In this case, Vi is the voltage across the cable 12 due to the voltage divider caused by the TDR 16 source impedance and the cable impedance. FIG. 4b shows a mid-cable circuit which has the cable 12 terminated by its own cable impedance. In this case, the output voltage is Vi, hence the equivalent driving voltage on the cable is 2Vi. FIG. 4c shows a far end of the cable 12 without a termination impedance. In this case, the 2Vi driving voltage holds as the transmitted pulse Vi+ and the reflected pulse Vi− add to give the equivalent driving voltage 2Vi on the cable 12. FIG. 4d shows the mid-cable circuit as seen by the reflected pulse and also has a 2Vi driving voltage. In FIG. 4e, the 2Vi driving voltage is terminated by the source impedance of the TDR 16 with its generator off. Thus, the voltage divider of the reflected pulse is:

$$Vr = 2Vi * (Zs + Zs)).$$

If the cable was lossless, then the attenuation caused by the mismatch alone is:

$$20 \log (Vr / Vi) = 20 \log (2Zs / (Zc + Zs)).$$

This factor is caused by the impedance mismatch and must be taken into account in the attenuation formula as a correction factor.

In view of the factors set forth above, the following equation sets forth the total attenuation caused by the cable 12:

Cable Attenuation = $1/2 * 20 \log((Vi/Vr) * (2*Zs/(Zc+Zs)))$.

where
Zs = TDR source impedance
Zc = cable impedance
Vr = amplitude of reflected pulse with cable connected.
Vi = amplitude of initial pulse with cable connected.

In order to determine the attenuation of the cable 12, the reflected pulse due to the end of the cable must be located. Reflected pulses can occur on the cable 12 due to (1) unmatched termination at the end of the cable and (2) an impedance change in the cable. There are two types of impedance changes which may occur in the cable 12. An increase in impedance is generally caused by a faulty cable splice. A decrease in impedance generally occurs when one cable is tapped into another, which is commonly called a bridge tap. This condition exists when there are two telephone extensions on the same cable. Additionally, a decrease in impedance will also occur if the cable is shorted. It should be noted that changes in impedances also may be as a result of changes of cable types or normal splices. These types of impedance changes are more subtle and the detection of these are not the objective of the present invention. One of the objectives of the present invention is to detect significant discontinuities.

Collectively, the impedance changes noted above are referred to as discontinuities. In order to calculate the attenuation, the reflected pulse which is caused by the end of the cable 12 must be determined. In the present invention, the application program searches for discontinuities which are caused by impedance changes that are equal to or greater than twice the cable impedance or equal to or less than one half the cable impedance. These discontinuities are called significant and will not allow the operation of digital telephones or digital communications on the cable.

As noted above, the present invention determines the presence and the location of bridge taps on the cable 12, whether the opposite end of the cable is open and whether the opposite end of the cable is shorted. A bridge tap is caused by two cables with impedance Z wired in parallel. The impedance of the bridge tap will be ½ Z. The bridge tap, in response to the incident pulse, will cause the generation of a waveform having a negative and a positive discontinuity. An open end of the cable 12 will cause a single positive discontinuity. If the end of the cable 12 is shorted, a single negative discontinuity is generated in response to the incident pulse from the TDR 16. Moreover, a faulty splice on the cable 12 will cause a positive discontinuity in addition to the positive discontinuity indicating the end of the cable. Thus, if only one positive discontinuity is found, it indicates the location of the end of the cable and the attenuation is calculated from that pulse. If more than one positive discontinuity or a negative discontinuity is found, then a bridge tap or other cable fault exists which prevents the operation of digital telephones or communications on the cable 12.

Figure 5A:
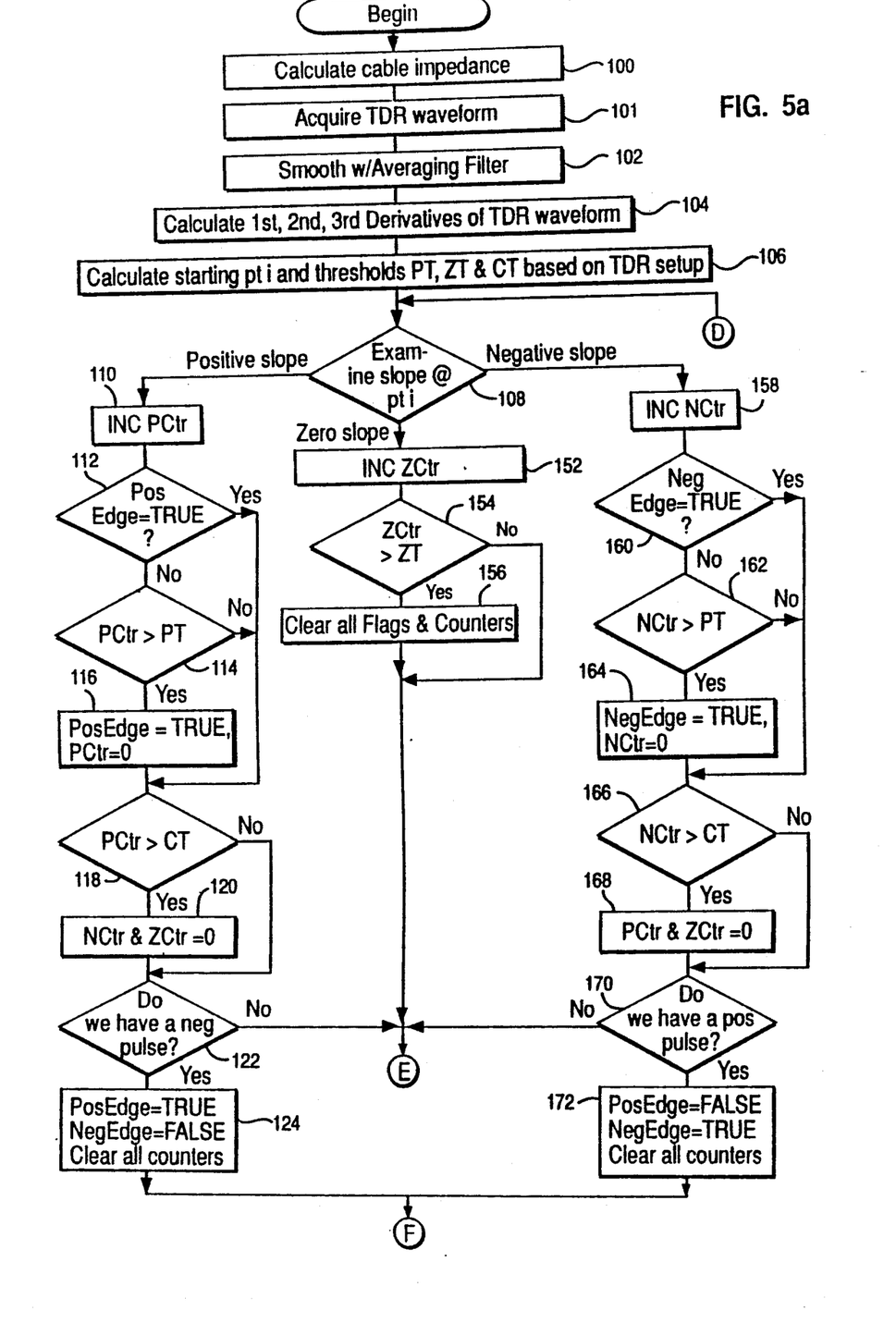
FIG. 5a-5b shows a flow diagram illustrating system operation for determining characteristics of the communication cable of FIG. 1.
Figure 5B:
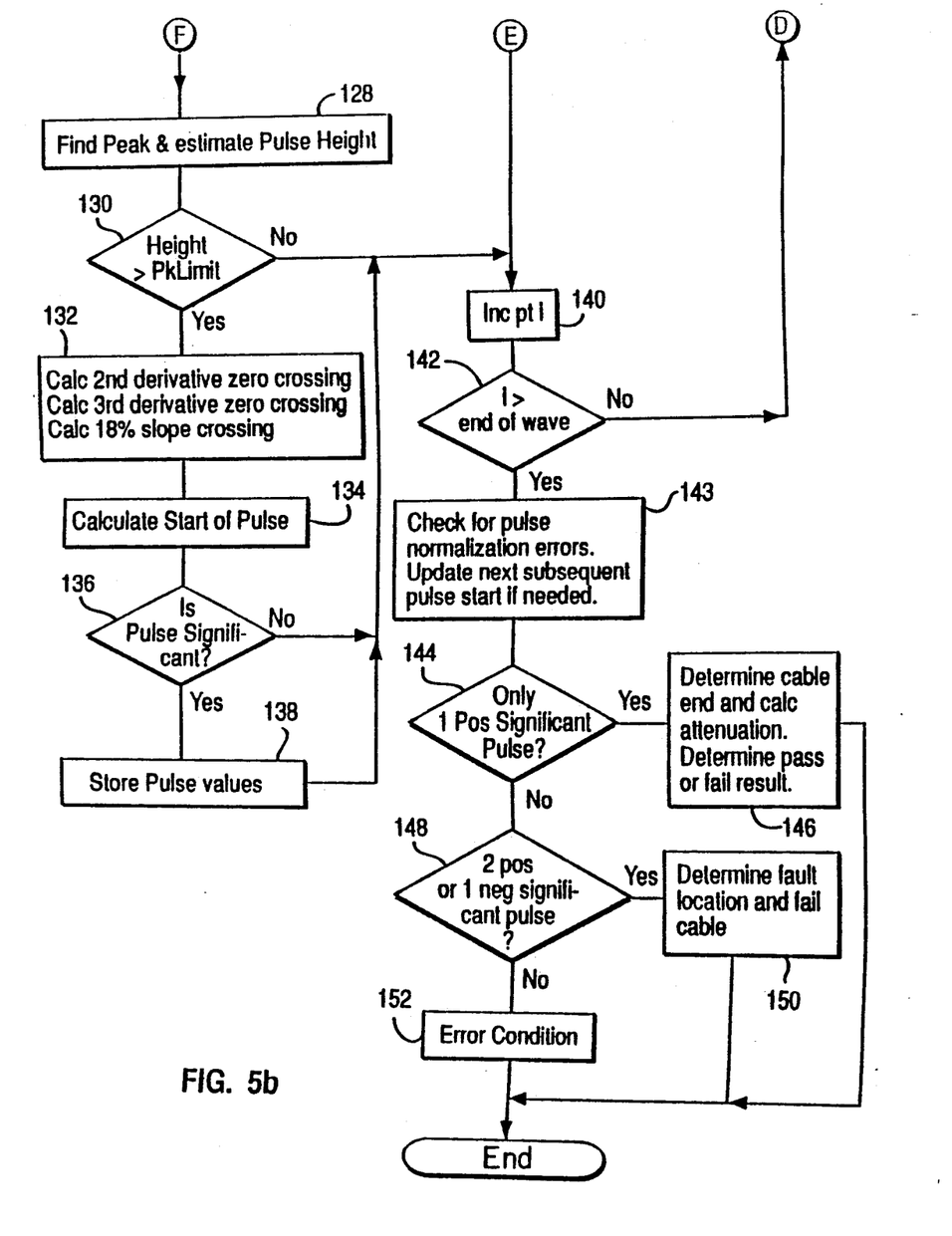

Referring to FIG. 5, there is shown a flow chart illustrating the steps of the application program used by system 10 (FIG. 1) in determining whether cable 12 will support digital telephones or communications thereon. The application first determines the presence of a pulse generated by a discontinuity on cable 12 in response to the incident pulse from the TDR 16. As noted above, the application program analyzes the waveform data acquired by the TDR 16. The application program determines the presence of significant pulses in the waveform in order to determine the location of the end of the cable 12, the cable attenuation and the presence of bridge taps. In step 100, the impedance of the cable 12 is determined. This is accomplished by comparing the magnitude of the incident pulse generated by the TDR 16 with the cable 12 unattached thereto with the magnitude of the incident pulse of the TDR with the cable attached. In step 101, prior to acquiring a waveform from the TDR 16, (1) the gain acquisition of a full scale reflected waveform, (2) all flags and counters are cleared and (3) the TDR 16 source impedance is set to closely match the calculated cable impedance (Zc). The waveform, which is acquired in step 101 in digital form, is processed using an averaging filter in step 102 to remove any high frequency random noise therefrom. The acquired waveform consists of an array of integers representing an amplitude of the waveform at a plurality of time samples. In step 104, first, second and third derivatives of the plurality of time samples of the acquired waveform are calculated. In step 106, a starting point (pt i) is selected on the waveform which is beyond the width of the source or incident pulse. The pulse width, velocity of propagation (Vp), and the distance-per-division setting of the TDR 16, are used to determine the width of the source or incident pulse in time sample units. Using the width of the incident pulse, the following three thresholds are calculated: (1) threshold for clearing the counters (CT), (2) threshold for finding a pulse edge (PT) and (3) threshold for zeroing all counters and flags (ZT). Step 108 determines the slope of the starting point, pt i.

If the slope is determined to be positive, a positive counter, PCtr, is incremented in step 110. PCtr stores the number of positive slope points detected in the acquired waveform. Step 112 determines whether a positive edge of the waveform has previously been detected. If the determination in step 112 is negative, step 114 determines whether the value of the positive counter exceeds the number of positive slope points or pulse threshold (PT) needed for finding a valid pulse edge. If the value of the positive counter (PCtr) exceeds the pulse threshold (PT), the positive edge has been detected and a flag, PosEdge, is set to TRUE and the positive counter is cleared in step 116. Step 118 determines whether the positive counter (PCtr) exceeds the clear threshold (CT). The clear threshold (CT) prevents the operation of other counters in response to noise signals. If the value associated with the positive counter (PCtr) exceeds the clear threshold (CT), counters NCtr and ZCtr are cleared in step 120. Counter NCtr stores the number of negative slope points and counter ZCtr stores the number of zero slope points. Step 122 determines whether a negative pulse has been detected. This determination is accomplished by determining whether flags PosEdge and NegEdge are both set to TRUE. If both flags are TRUE, a negative-going pulse has been detected with a valid width.

In step 124, all slope counters are cleared, the PosEdge flag is set and the NegEdge flag is cleared. In step 128, the peak of the pulse is determined and height of the pulse is estimated. The height of the pulse is estimated using the point where the slope began to become negative-going such as the start of the pulse for a 1000 ns pulse or the point where the pulse crossed the zero line for a 100 ns pulse. A comparison is made in step 130 to determine whether the height of the pulse is greater than an amplitude threshold (PkLimit) used to qualify pulses. In essence, the height of the pulse is normalized to the gain of the TDR 16 needed to check for significance at the location of the peak of the pulse using the following gain equations where "X" is the location of the pulse in feet:

For 100 ns pulse:

Significance Threshold (dB) = $14.3 + 0.0227 * X$
(distance in feet)

For 1000 ns pulse:

Significance Threshold (dB) = $14.2 + 0.00863 * X$
(distance in feet)

Using these equations, a pulse height greater than one TDR screen division is considered significant. At this point in the application program the pulse height is only an estimate, therefore, a more conservative limit will be used for this preliminary pulse height examination. Thus, if this height is greater than one-half a TDR screen division, control is transferred to step 132. In step 132, the second and third derivatives are examined on each point from the pulse's peak location back toward the start of the pulse to determine where the second and the third derivatives approximate zero. Using the slope at the second derivative zero crossing point, we find the point where the slope has dropped to 18% of its value at the second derivative zero crossing. Using the second derivative zero crossing point, the third derivative zero crossing point and the 18% slope crossing point, the start of the pulse is calculated in step 134. However, if the third derivative zero crossing point or the 18% slope crossing point is positioned within a pulse which was previously detected, the start of the pulse is the second derivative zero crossing point and the larger of the other two crossing points is saved as an auxiliary starting point which may be needed in step 143. Otherwise, the start of the pulse is the larger of the other two crossing points. However, in the case of the 100 ns pulse only, if a negative pulse is detected, the auxiliary starting point of the pulse is the zero crossing of the waveform as originally acquired from the TDR 16. In step 136, the location of the start of the pulse is used to determine a new pulse height. As noted above, the height is normalized to the gain needed to check for discontinuities. Since normalizing the height can cause large resolution errors, again we must use a more conservative limit in examining the pulse height. The one screen division height limit will not be used until step 143 checks for normalization errors. Thus, if the height of the pulse is greater than three-fourths of a TDR screen division, the values of the peak and the location of the start of the pulse are saved in step 138. In steps 140 and 142, the next one in the plurality of time samples is selected and a determination is made whether the end of the waveform has been reached, respectively. If there are other time samples to be processed, control is transferred to step 108 for further processing.

If the end of the waveform has been reached, step 143 checks for normalization errors in the stored pulse values. These occur when the gain difference between the acquired waveform gain and the gain value used for normalization is greater than 18 dB. If this occurs, the pulse is measured from the TDR 16 using the gain value from the gain equations to check for significance. Otherwise, the pulse is normalized and if either the normalized or measured pulse height pulse is greater than one TDR screen division, the pulse is counted as significant. If the pulse is not significant, the start of the next subsequent pulse may be changed to the auxiliary starting point which was saved earlier if the previous pulse affected the calculation of its starting location. Step 144 determines whether only one positive significant pulse was detected. If only one positive significant pulse was detected, the location of the start of the pulse indicates the end of the cable from which the length can be calculated. Moreover, the attenuation is calculated at the start of the pulse. As noted above, the impedance of the cable has previously been calculated. Thus, given the impedance, attenuation and length of the cable, a signal/noise ratio is calculated for the cable to determine whether the cable will support the operation of digital telephones or digital communications.

In step 148, if more than one positive or only one negative significant pulse was detected, a fault on the cable exists. Step 150 calculates the location of the fault which is the location where the first reflected pulse started. The presence of the fault on the cable will prevent the operation of digital telephones or digital communications thereon. Otherwise, if the determinations in step 144 and 148 are both negative, an error condition exists in step 152 and must be corrected prior to continuing to test the cable 12.

If it was determined in step 108 that the slope of the sample point was zero, the zero slope counter (ZCtr) is incremented in step 152. The contents of counter ZCtr and the value of the zero threshold ZT are compared in step 154. If the value stored in counter ZCtr is greater, all flags and counters are cleared in step 156. Thereafter, control is transferred to step 140 for processing in the manner described above.

If it was determined in step 108 that the slope of the sample point was negative, the negative slope counter is incremented in step 158. Thereafter, steps 160 through 172 are followed in a manner which is similar to steps 112 through 124 described above for the positive slope. Similarly, if it is determined in step 170 that a positive-going pulse has been detected, control is transferred to step 140 for further processing. Otherwise, the PosEdge flag is cleared, the NegEdge flag is set and the counters are cleared in step 172. Thereafter, control is transferred to step 128 for processing in the manner described above.

While the invention has been particularly shown and described with reference to a preferred embodiment, it will be understood by those skilled in the art that various changes in form and detail may be made without departing from the spirit and scope of the invention.

What is claimed is:

1. A system for determining whether a communication cable will support digital communications thereon, said system includes:

means for transmitting a pulse over said communications cable;

means for detecting responsive to said transmitted pulse at least one pulse reflected from said communication cable;

means for derivative characteristics of said at least one reflected pulse, the derivative characteristics including a first derivative, a second derivative, and a third derivative; and means for analyzing said at least one reflected pulse and its derivative characteristics to determine whether said communication cable will support digital communications thereon, said analysis being performed from one end of said communication cable.

2. The system as recited in claim 1 further includes means for determining whether said detected at least one reflected pulse is significant.

3. The system as recited in claim 2 wherein said analyzing means includes means for determining the number of significant pulses detected.

4. The system as recited in claim 3 further includes means for calculating impedance characteristics of said communication cable.

5. A system for determine whether a communication cable will support digital communications thereon, said system includes:

means for transmitting a pulse over said communications cable;

means for detecting responsive to said transmitted pulse at least one pulse reflected from said communication cable;

means for deriving derivative characteristics of said at least one reflected pulse;

means for calculating impedance characteristics of said communication cable;

means for analyzing said at least one reflected pulse and its derivative characteristics to determine whether said communication cable will support digital communications thereon, said analysis being performed from one end of said communication cable; and means for determining whether said detected at least one reflected pulse is significant; wherein said analyzing means includes means for determining the number of significant pulses detected; and wherein only one positive significant pulse was detected and further includes:

means for determining a length of said communication cable;

means for calculating attenuation characteristics of said communication cable; and means, responsive to the length, the impedance and the attenuation of said cable, for calculating a signal-to-noise ratio for said communication cable.

6. The system as recited in claim 3 wherein one negative significant or more than one positive significant pulse was detected and further includes means for determining a location of a fault which exists on the communication cable which is indicated by a starting point of said negative significant pulse or a starting point of a first of said more than one positive significant pulse.

7. A method of determining whether a communication cable will support digital communications thereon, said method includes the steps of:

transmitting a pulse over said communications cable;

detecting responsive to said transmitted pulse at least one pulse reflected from said communication cable;

deriving derivative characteristics of said at least one reflected pulse, the derivative characteristics including a first derivative, a second derivative, and a third derivative; and analyzing said at least one reflected pulse and its derivative characteristics to determine whether said communications thereon, said analysis being performed from one end of said communication cable.

8. The method as recited in claim 7 further includes the step of determining whether said detected at least one reflected pulse is significant.

9. The method as recited in claim 8 wherein said step of analyzing includes the step of determining the number of significant pulses detected.

10. The method as recited in claim 9 further includes the step of calculating impedance characteristics of said communication cable.

11. A method of determining whether a communication cable will support digital communications thereon, said method includes the steps of:

transmitting a pulse over said communications cable;

detecting responsive to said transmitted pulse at least one pulse reflected from said communication cable;

deriving derivative characteristics of said at least one reflected pulse;

analyzing said at least one reflected pulse and its derivative characteristics to determine whether said communication cable will support digital communications thereon, said analysis being performed from one end of said communication cable;

determining whether said detected at least one reflected pulse is significant; wherein said step of analyzing includes the step of determining the number of significant pulses detected; and calculating impedance characteristics of said communication cable; and wherein only one positive significant pulse was detected and further includes the steps of:

determining a length of said communication cable;

calculating attenuation characteristics of said communication cable; and using said length, impedance characteristics, and attenuation characteristics of said communication cable to determine whether said cable will support digital communications by calculating a signal-to-noise ratio for said communication cable.

12. The method as recited in claim 9 wherein one negative significant or more than one positive significant pulse was detected and further includes the step of determining a location of a fault which exists on the communication cable which is indicated by a starting point of said negative significant pulse or a starting point of a first of said positive significant pulse.

13. A system for determining whether a communication cable will support digital communications thereon, said system includes:

means for transmitting a pulse over said communication cable;

means for detecting responsive to said transmitted pulse at least one pulse reflected from said communication cable;

means for determining whether said detected at least one reflected pulse is significant;

means for analyzing said at least one reflected pulse to determine the number of significant pulses detected;

means for calculating impedance characteristics of said communication cable;

means for determining a length of said communication cable;

means for calculating attenuation characteristics of said communication cable;

means, responsive to a length, the impedance and the attenuation of said cable, for calculating a signal-to-noise ratio for said communication cable; and means for analyzing said at least one reflected pulse to determine whether said communication cable will support digital communications thereon, said analyzing being performed from one end of said communication cable.

14. A method of determining whether a communication cable will support digital communications thereon, said method includes the steps of:

transmitting a pulse over said communication cable;

detecting responsive to said transmitted pulse at least one pulse reflected from said communication cable;

determining whether said detected at least one reflected pulse is significant;

analyzing said at least one reflected pulse to determine the number of significant pulses detected;

calculating impedance characteristics of said communication cable;

determining a length of said communication cable;

calculating attenuation characteristics of said communication cable;

using said length, impedance characteristics, and attenuation characteristics of said communication cable to calculate a signal-to-noise ratio for said communication cable; and analyzing said at least one reflected pulse to determine whether said communication cable will support digital communications thereon, said analysis being performed from one end of said communication cable.

* * * * *